United States Patent [19]

Gardner

[11] Patent Number: 5,679,982
[45] Date of Patent: Oct. 21, 1997

[54] BARRIER AGAINST METAL DIFFUSION

[75] Inventor: Donald S. Gardner, Mountain View, Calif.

[73] Assignee: Intel Corporation, Santa Clara, Calif.

[21] Appl. No.: 695,970

[22] Filed: Aug. 13, 1996

Related U.S. Application Data

[63] Continuation of Ser. No. 22,349, Feb. 24, 1993, abandoned.

[51] Int. Cl.$^6$ .................. H01L 23/48; H01L 23/52; H01L 29/40
[52] U.S. Cl. .................. 257/758; 257/635; 257/751; 257/752
[58] Field of Search .................. 257/751, 752, 257/767, 763, 765, 764, 635, 626, 758, 757, 310, 753

[56] References Cited

U.S. PATENT DOCUMENTS

| | | | |
|---|---|---|---|
| 3,106,489 | 10/1963 | Lepselter | 257/751 |
| 3,386,894 | 6/1968 | Steppat | 257/763 |
| 3,507,756 | 4/1970 | Wenger | 257/763 |
| 3,609,471 | 9/1971 | Scace et al. | 317/234 R |
| 3,848,260 | 11/1974 | Tsunemitsu et al. | 257/763 |
| 4,146,440 | 3/1979 | Thompson | 204/15 |
| 4,166,193 | 8/1979 | Schmidt et al. | 174/28 |
| 4,206,472 | 6/1980 | Chu et al. | 257/760 |
| 4,561,009 | 12/1985 | Yonezawa et al. | 257/765 |
| 4,769,345 | 9/1988 | Butt et al. | 437/217 |
| 4,816,895 | 3/1989 | Kikkawa | 257/757 |
| 4,884,120 | 11/1989 | Mochizuki et al. | 257/752 |
| 4,896,204 | 1/1990 | Hirata et al. | 257/765 |
| 4,926,237 | 5/1990 | Sun et al. | 257/758 |
| 5,015,604 | 5/1991 | Lim et al. | 437/192 |
| 5,021,869 | 6/1991 | Kaw | 257/737 |
| 5,060,050 | 10/1991 | Tsuneoka et al. | 257/758 |
| 5,126,163 | 6/1992 | Chan | 427/38 |
| 5,210,054 | 5/1993 | Ikeda et al. | 437/195 |
| 5,369,303 | 11/1994 | Wei | 257/751 |
| 5,372,974 | 12/1994 | Doan et al. | 437/240 |
| 5,401,680 | 3/1995 | Abt et al. | 437/52 |
| 5,465,004 | 11/1995 | Lim et al. | 257/529 |
| 5,580,825 | 12/1996 | Labunov et al. | 437/194 |

FOREIGN PATENT DOCUMENTS

| | | | |
|---|---|---|---|
| 62-200764 | 9/1987 | Japan | 257/763 |
| 63-111666 | 5/1988 | Japan | 257/753 |

OTHER PUBLICATIONS

IBM TDB vol. 20, No. 7, Dec. 1977 Self-Aligned Fine Line Process for Making Capacitor Memories Geipel, et al. pp. 2588-2589.

*Primary Examiner*—Mahshid D. Saadat
*Assistant Examiner*—T. M. Arroyo
*Attorney, Agent, or Firm*—Blakely, Sokoloff, Taylor & Zafman

[57] ABSTRACT

A method of forming a barrier layer for preventing the diffusion of a metal interconnect through an interlayer dielectric of an integrated circuit and to act as an etch stop. A thin metal layer is formed on the interlayer dielectric and then oxidized to form a metal-oxide barrier layer.

12 Claims, 6 Drawing Sheets

BARRIER AGAINST METAL DIFFUSION

This is a continuation of application Ser. No. 08/022,349, filed Feb. 24, 1993 now abandoned.

BACKGROUND OF THE INVENTION

1. Field of the Invention

The present invention relates to the field of integrated circuit manufacturing, and more specifically, to an interconnect structure for a multilevel integrated circuit.

2. Discussion of Related Art

Modem integrated circuits are made up of literally millions of active devices such as transistors and capacitors. These devices are initially isolated from one another but are later interconnected together to form functional circuits. The quality of the interconnect structure drastically affects the performance and reliability of the fabricated integrated circuit. Interconnections are increasingly determining the limits in performance and density of modem ultra-large scale integrated (ULSI) circuits.

FIG. 1 is a cross-sectional illustration of an interconnect structure which is presently widely used in the semiconductor industry. It comprises a silicon substrate 101 in which active devices (not shown) are formed. An interlayer dielectric (ILD) 103 is formed over the substrate to isolate Al interconnect lines 105 and 107 from the active devices. The Al lines interconnect various devices to form functional circuits. The Al lines are coupled to the substrate by metal plugs 109 and 111.

Aluminum and its alloys have been widely used as lines 105 and 107 in interconnect structures because of its good resistivity (2.7 $\mu\Omega$-cm) and its good adhesion to $SiO_2$, which is typically used as an ILD. Additionally, aluminum doped with copper does not diffuse through the ILD 103 and interact with the substrate below. Unfortunately, aluminum offers poor resistance to electromigration which increases the potential for open circuits or voids. Additionally, aluminum thin films form hillocks at relatively low temperatures. Aluminum lines are also susceptible to humidity-induced corrosion.

In an attempt to improve the performance, reliability, manufacturability, and density of interconnects, alternative metals to aluminum and aluminum alloy interconnects have been proposed. Copper (Cu), gold (Au), silver (Ag) and tungsten (W) have all been proposed as substitutes for aluminum metalization. Copper has an extremely low resistivity (1.7 $\mu\Omega$-cm) and is resistant to electromigration. Similarly, gold has a low resistivity (2.2 $\mu\Omega$-cm) and also exhibits strong resistance to electromigration. A low resistivity interconnect metal increases the performance of the interconnect structure, and an electromigration resistant interconnect metal improves the reliability of the interconnect structure. These qualities make copper, gold, and silver good candidates as an interconnect metal for multilevel integrated circuits.

Unfortunately, as shown in FIG. 2, gold, silver, and copper all readily diffuse through $SiO_2$ and other ILD materials such as polyimides and parylene. Diffusion 209 of metal lines 205 and 207 can readily destroy active devices formed in substrate 201. Additionally, gold, silver, and copper all have poor adhesion to silicon dioxide ($SiO_2$). Metal adhesion to underlying substrate materials must be excellent in order to form reliable interconnect structures.

In an attempt to solve the problem of metal diffusion, barrier layers of silicon nitride ($Si_3N_4$) 309 have been proposed as shown in FIG. 3. Barrier layer 309 prevents metal diffusion through ILD 303 to silicon substrate 301 below. Silicon nitride, however, has a high dielectric constant. Additionally, silicon nitride must be formed thick in order to form an adequate barrier against metal diffusion. Silicon nitride's high dielectric constant coupled with the large thickness required to prevent metal diffusion results in a large interconnection capacitance. Silicon nitride barrier layers are, therefore, unsuitable for modern high performance ULSI interconnect structures.

Thus, what is desired is a novel, high performance, interconnect structure with a ULSI manufacturable process in which the metal for the lines does not diffuse through the interlayer dielectric.

SUMMARY OF THE INVENTION

A novel, high performance, planar, reliable interconnect structure with a ULSI manufacturable process is described. An interlayer dielectric is formed over a silicon substrate having active devices formed therein. A thin metal layer of aluminum or titanium is sputtered, evaporated or ion implanted over the interlayer dielectric. Next, the thin metal layer is oxidized to form a metal-oxide barrier layer. The thin metal layer can be oxidized by thermal cycling in an oxygen ambient at a temperature of approximately 250° C. or oxidized by ion implantation with oxygen or oxidized by anodic oxidation. Additionally, a thin metal-oxide layer formed by CVD can be used in place of the oxidized metal layer. The metal-oxide barrier layer and interlayer dielectric are then etched to form contact openings to the substrate and devices below. Next, a tungsten layer is blanket deposited over the metal-oxide barrier layer. The blanket deposition completely fills the contact openings. Next the metal layer is chemically-mechanically etched back to the metal-oxide barrier layer such that the metal-oxide barrier layer and the filled contact openings are substantially planar. The extremely hard metal-oxide barrier layer acts as a mechanical stop for the chemical-mechanical etch back. A metal interconnect comprising copper, gold, or silver is then formed on the metal oxide barrier layer and on the metal contact. A second metal-oxide barrier layer can be formed around the metal interconnect in order to encapsulate the metal interconnect. The second metal-oxide barrier layer prevents lateral diffusion and corrosion of the metal interconnect. The second metal-oxide barrier layer is formed in a manner similar to the first metal-oxide barrier layer.

A goal of the present invention is to provide a planar, high performance, reliable interconnect structure for a multilevel integrated circuit which has a ULSI manufacturable process.

Another goal of the present invention is to form a reliable interconnect structure which allows the use of high performance interconnect metals such as gold, silver, and copper.

Yet another goal of the present invention is to provide an interconnect structure which is not susceptible to diffusion of gold, silver, or copper interconnect lines through the interlayer dielectric.

Still yet another goal of the present invention is to provide an interconnect structure which allows the use of a chemical-mechanical polishing process to produce an extremely planar surface.

Still yet another goal of the present invention is to provide an interconnect structure wherein the interconnect metals copper, gold, and silver exhibit excellent adhesion to the structure below.

Still further, another goal of the present invention is to provide an interconnect structure having a barrier layer which can be formed thin and still prevent the diffusion of gold, silver, and copper through an interlayer dielectric.

Finally, another goal of the present invention is to provide an interconnect structure wherein metal interconnects are completely encapsulated in a layer which prevents lateral diffusion and corrosion.

Still other goals and advantages of the novel interconnect structure of the present invention will be evident from the detailed description of the present invention which follows.

BRIEF DESCRIPTION OF THE DRAWINGS

FIG. 4b is a cross-sectional illustration of the oxidation or anodization of the thin metal layer formed on the substrate of FIG. 4a.

FIG. 5b is a cross-sectional illustration showing the patterning of the interlayer dielectric and the metal-oxide barrier layer on the substrate of FIG. 5a.

DETAILED DESCRIPTION OF THE PRESENT INVENTION

The present invention describes a novel, reliable, planar, high performance interconnect structure and its' method of fabrication. In the following description numerous details are set forth such as material types and thicknesses etc., in order to provide a thorough understanding of the present invention. It will be obvious, however, to one skilled in the art that the present invention may be practiced without these specific details. In other instances well-known semiconductor manufacturing processes and equipment have not been described in detail in order to not unnecessarily obscure the present invention.

The present invention is a novel, reliable, high performance interconnect structure and method of fabrication. The present invention is ideally suited for multi-level metalization interconnects used to interconnect active devices formed on a silicon substrate into functional circuits. A novel barrier layer prevents the diffusion of a metal conductor through an interlayer dielectric (ILD). The barrier layer has excellent adhesion to the ILD. The barrier layer allows the use of high performance metals such as copper (Cu), gold (Au), and silver (Ag) as interconnect metals. Before the present invention such metals could not be used as interconnect materials because of their diffusion problems and poor adhesion to ILDs such as $SiO_2$. The interconnect structure of the present invention has an extremely manufacturable process allowing for high density integrated circuits to be uniformly and reliably manufactured. High density circuits increase circuit performance (i.e. speed) and increase functional complexity of circuits.

Figure 1:
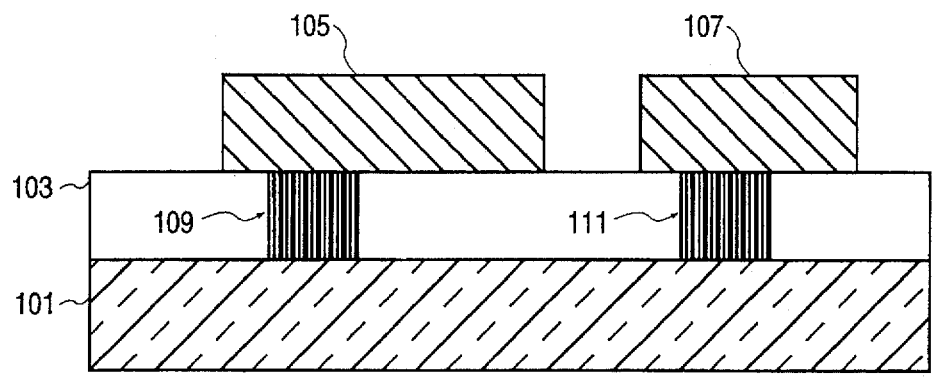
FIG. 1 is a cross-sectional illustration of a well-known interconnect structure utilizing aluminum interconnect lines and metal plugs.
Figure 2:
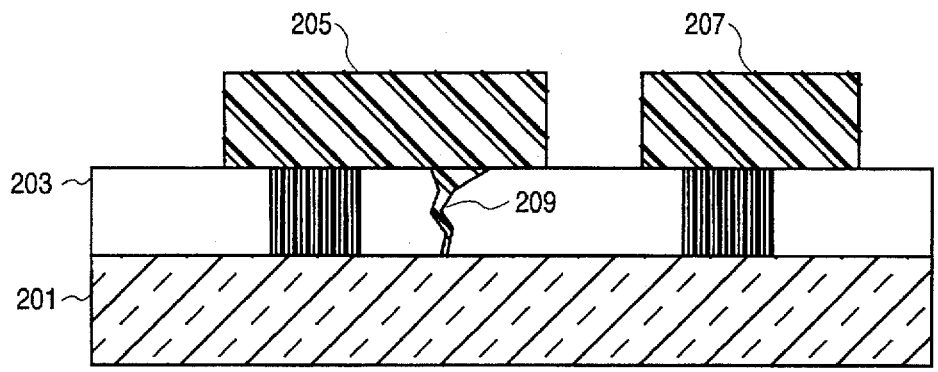
FIG. 2 is cross-sectional illustration of an interconnect structure utilizing copper interconnect lines.
Figure 3:
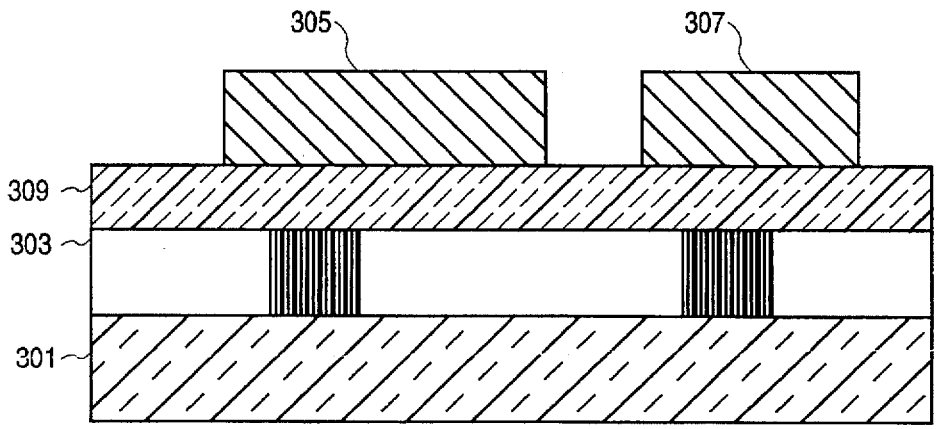
FIG. 3 is a cross sectional illustration of an interconnect structure utilizing a silicon nitride barrier layer.
Figure 4A:
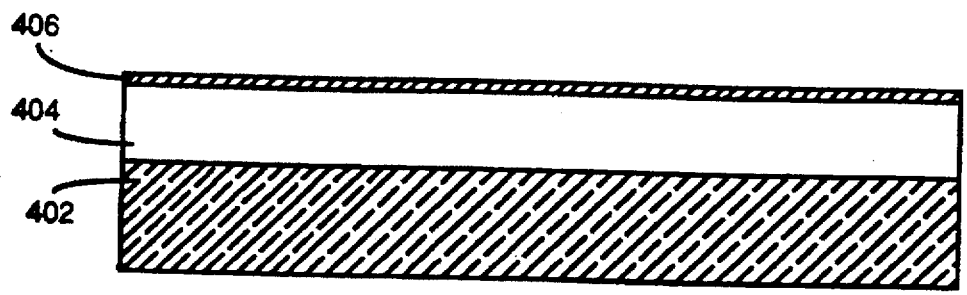
FIG. 4a is a cross-sectional illustration of a semiconductor substrate having an interlayer dielectric formed on it and a thin metal layer formed on the interlayer dielectric.

The present invention will be explained with respect to a first level of metalization in a multilevel integrated circuit. It is to be appreciated that the teachings of the present invention are equally applicable to higher levels of metalization. As shown in FIG. 4a, in fabrication of the interconnect structure of the present invention, a doped silicon substrate 402 is provided. Formed in and on the substrate 402 are devices (not shown) such as transistors, capacitors, and resistors. Such devices can be formed with well-known semiconductor processing procedures. It is to be appreciated that patterned polysilicon layers, gate oxide layers, and field oxide layers may be formed on substrate 402 in order to manufacture and isolate the active devices. The devices are next interconnected together to form functional circuits.

First an interlayer dielectric (ILD) 404 is formed over substrate 402 and over the devices formed on substrate 402. The ILD is formed to a thickness of between 4000–10000 Å by techniques well-known in the art. Normally the ILD is a silicon dioxide ($SiO_2$) layer, but other materials such as polyimides, silicon nitrides, and parylene may also be used. Additionally, the ILD can be a composite layer or a layer formed by a dep-etch process. What is important is to form a quality, planar insulative layer that has good adhesion to substrate 402. Next, as shown in FIG. 4a, a thin metal layer 406 is formed on the ILD 404. The metal layer 406 is formed to a thickness of between 50–1000 Å with approximately 200 Å being preferred. In the preferred embodiment the metal layer is aluminum, but other metals with good adhesion such as titanium or tungsten or an alloy such as $TiAl_x$ can be used. The thin metal layer 406 of the present invention can be formed by well-known sputtering or evaporation techniques. A Varian 3190 sputter machine can be used.

As an alternative to sputtering or evaporating thin metal layer 406, metal ions can be implanted into the top surface of ILD 404. Conventional implanting equipment and techniques can be utilized. Implanting metal ions to form metal layer 406 allows a very thin and uniform layer to be formed. Small doses can be easily controlled by using ion implantation techniques. The ability to form a thin metal layer 406 improves the electrical and manufacturing characteristics of the interconnect structure.

Figure 4B:
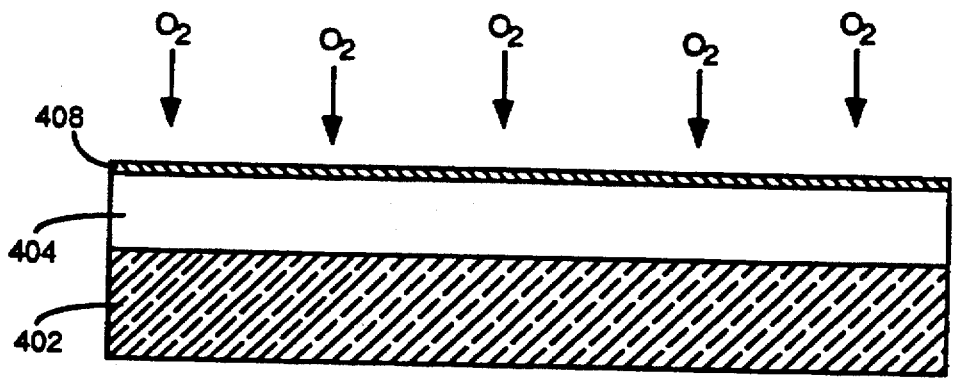

Next, as shown in FIG. 4b, thin metal layer 406 is oxidized to form barrier layer 408. In the preferred embodiment thin metal layer 406 is oxidized by thermally cycling in an oxygen ambient. For example, the substrate can be placed in standard furnace in an $O_2$ ambient at atmospheric pressure at approximately 250° C. for approximately 10 minutes. It is to be appreciated that other methods may be utilized to oxidize metal layer 406. For example, oxygen atoms can be ion implanted into metal layer 406 to form barrier layer 408. Another method would be to use anodic oxidation of metal layer 406 wherein an electro chemical process is used to form metal-oxide barrier layer 408 from metal layer 406. Additionally, it is to be appreciated that instead of forming a metal layer 406 and then oxidizing it to form barrier layer 408, one can directly form a metal-oxide layer 408 by CVD. For example, a metal organic precursor, such as Triisobutylaluminum (TIBA), can be used in a CVD reaction with oxygen to directly form metal-oxide barrier layer 408. In another embodiment, metal-oxide barrier layer 408 can be formed directly with a reactive sputtering process.

After oxidation, barrier layer 408 comprises metal-oxide compounds such as $Al_2O_3$, $Al_2O_x$, or $TiO_2$, $TiO_x$ depending upon the type of thin metal film used. It is to be appreciated that metal-oxide compounds and especially aluminum oxide compounds and $TiAl_xO_y$ compounds can be extremely hard and effective barriers against diffusion. These metal-oxides allow barrier layer 408 to be formed thin and still adequately prevent metal diffusion. Additionally, metal-oxides like $Al_2O_3$ and $TiO_2$ adhere well to $SiO_2$ layers. Although $Al_2O_3$ has a higher dielectric constant than does $SiO_2$, only a thin layer of $Al_2O_3$ is required to prevent diffusion. In this way the performance of the interconnect structure does not suffer from the high dielectric constant of barrier layer 408.

It is to be appreciated that when a thin metal layer is formed on an $SiO_2$ interlayer dielectric, a metal-oxide layer is formed due to a reaction between oxygen in the ILD and the metal layer. In this case an oxidation step may not be necessary to form thin metal layer 406 into a metal-oxide barrier layer 408. The use of an oxidation step, however, is still preferred in order to ensure that a consistent and uniform barrier layer is formed across the wafer and from wafer to wafer.

Figure 4C:
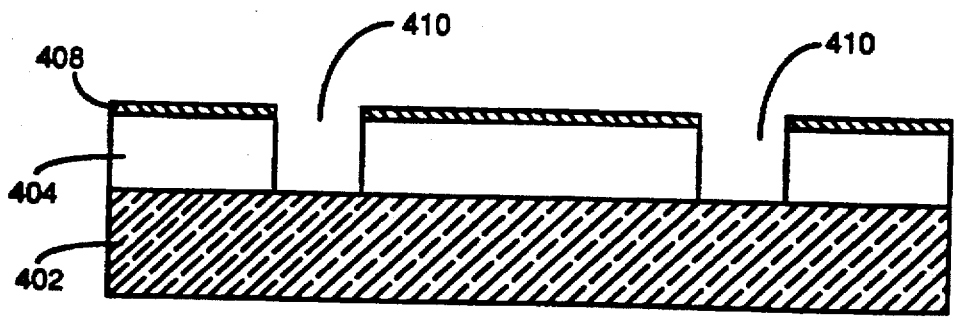
FIG. 4c is a cross-sectional illustration showing the formation of contact openings in the substrate of FIG. 4b.
Figure 4D:
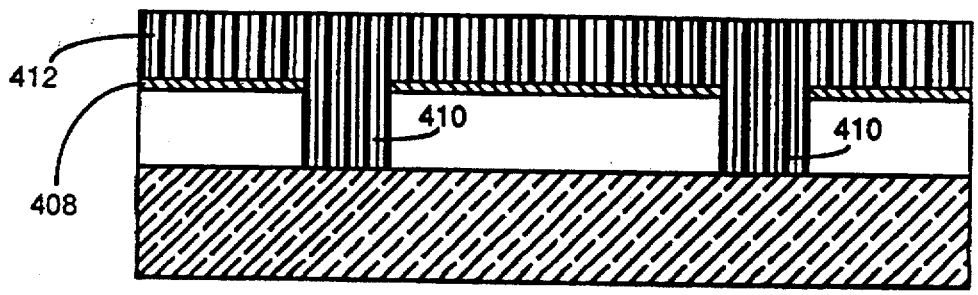
FIG. 4d is a cross-sectional illustration showing the formation of a metal layer over the substrate of FIG. 4c.

Next, as shown in FIG. 4c, contact openings (or vias) 410 are formed through ILD 404 and barrier layer 408 to substrate 402 below. The contact openings 410 allow an electrical connection to be made to the substrate and devices formed below. A photoresist layer (not shown) is masked, exposed, and developed with standard patterning techniques to define the location where contacts am to be formed. The contact openings 410 can be etched by first reactive ion etching (RIE) with a chlorine chemistry to etch the barrier layer 408 and then reactive ion etching with a fluorine chemistry to etch the ILD 404. The photoresist masking layer is removed after etching. Next, as shown in FIG. 4d, a metal layer 412 is blanket-deposited over barrier metal 408 and in contact openings 410 to form metal plugs. Although a variety of metals may be used, tungsten is preferred. A tungsten layer 412 can be formed by chemical vapor deposition (CVD) with well-know processes and equipment.

Figure 4E:
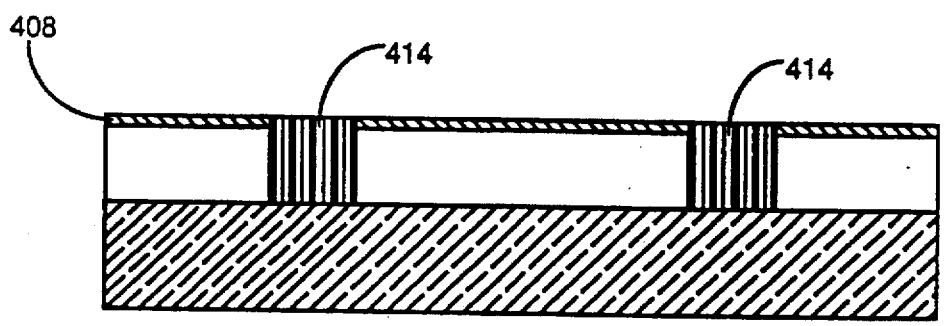
FIG. 4e is a cross-sectional illustration showing the formation of contact plugs on the substrate of FIG. 4d.

Next, as shown in FIG. 4e, metal layer 412 is etched back to form metal plugs 414. In the preferred embodiment of the present invention, the metal layer 414 is etched back by means of a chemical-mechanical polishing or a well-known RIE dry etching process. In a chemical-mechanical polishing process, an abrasive polish is used to remove the top surface of layer 412. In a chemical-mechanical polishing process, the substrate 402 is placed face down on a table covered with a pad which has been coated with an abrasive silica based material commonly referred to as "slurry". Both the substrate and the table are rotated relative to each other while a downward force is applied to substrate 402. The relative rotational movement of substrate 402 and the table facilitates the removal of the top portion of metal layer 412. Such chemical-mechanical polishing processes produce extremely planar surfaces.

The ability to form planar interconnect structures is extremely important in the manufacture of high density multilevel integrated circuits. The chemical-mechanical polishing process is made possible by barrier layer 408. Barrier layer 408, being an extremely hard substance, acts as a mechanical stop for the etch back of metal layer 412. Once the barrier layer 408 is reached, essentially no more material can be removed. In this way the top surfaces of barrier layer 408 and metal plugs 414 are uniform across the entire wafer's surface. Since minimal amounts of material are removed once barrier layer 408 is reached, wafers can be over-etched without adverse effects. Over-etching increases wafer throughput and eliminates rework. Over-etching ensures that all wafers from run to run are polished identically, making the present process extremely manufacturable. Also, over-etching insures that the wafer surface is completely uniform across the wafer.

As an alternative to the chemical mechanical etch-back of metal layer 412, a conventional plasma etch process may be utilized. Barrier layer 408 acts as an etch-stop and provides means to endpoint detect the etch-back. A plasma gas which is more selective to tungsten or metal layer 412 than to barrier layer 408 is chosen. In this way, areas which have not yet reached barrier layer 408 will continue to etch while those areas which have reached barrier layer 408 will essentially stop etching. (It is to be appreciated that metal contacts 414 can become over-etched with this process.) Additionally, by monitoring the gas residue for constituents of the barrier layer 408, it is possible to accurately detect the endpoint of the plasma etch-back.

Figure 4F:
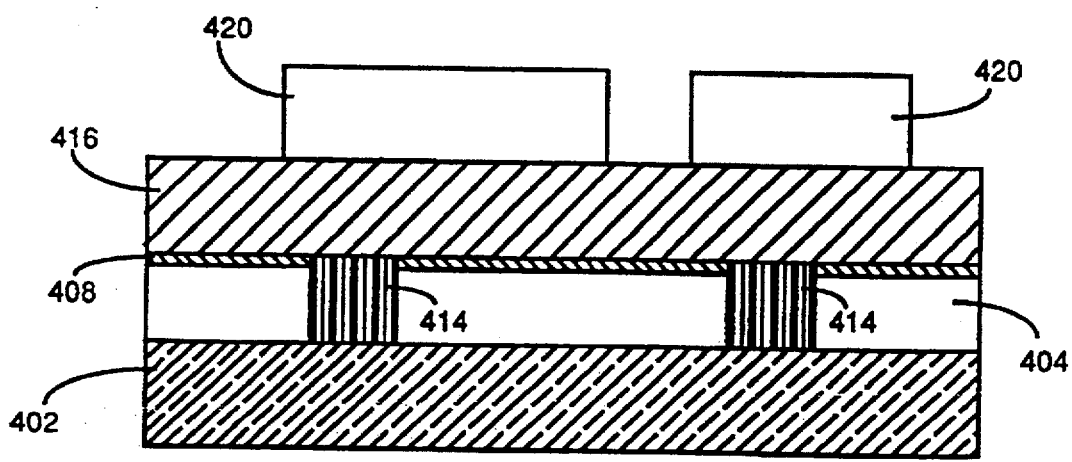
FIG. 4f is a cross-sectional illustration showing the formation of an interconnect metal layer on the substrate of FIG. 4e.

Next, as shown in FIG. 4f, an interconnect metal layer 416 is deposited over barrier layer 408 and metal contacts 414. The metal layer is used to form metal lines to interconnect various devices formed on substrate 402. The metal layer is formed to a thickness in the range of 3,000–10,000 Å. Although any well-known metal interconnect material can be used, metals such as copper, gold, and silver are preferred because of their extremely low resistivity and resistance to electromigration. Copper, gold, and silver can be used in the present invention because of barrier layer 408. Barrier layer 408 prevents the diffusion of interconnect metal layer 416 through ILD 404. Additionally, copper, gold, and silver all adhere well to barrier layer 408. Adhesion of interconnect metal layer 416 is extremely important in order to manufacture reliable integrated circuits.

Figure 4G:
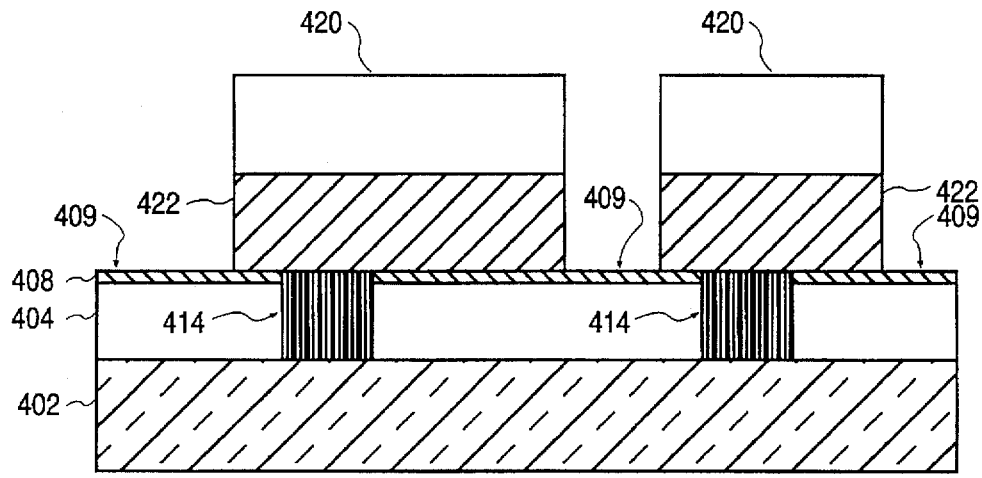
FIG. 4g is a cross-sectional illustration showing the formation of metal interconnect lines on the substrate of FIG. 4f.

Next, a masking layer such as photoresist 420 is formed over interconnect metal layer 416. The masking layer 420 is masked, exposed and developed to define the locations where metal lines will be formed. Next, as shown in FIG. 4g, metal layer 416 is patterned into individual metal lines 422 by reactive ion etching. An anisotropic etchants which is more selective to metal layer 416 than to barrier layer 408 is preferred. In this way barrier layer 408 provides an etch stop, allowing for the over etching of interconnection metal layer 416 which prevents electrical shorts between metal lines 422. It is noted that it may be desirable for manufacturing reasons to remove exposed portions 409 of barrier layer 408 after etching metal lines 422. A reactive ion etch using a chlorine chemistry can be utilized. It is, however, very important to use an etchants which is more selective to barrier layer 408 than to ILD 404 so that ILD 404 is not significantly etched.

Figure 4H:
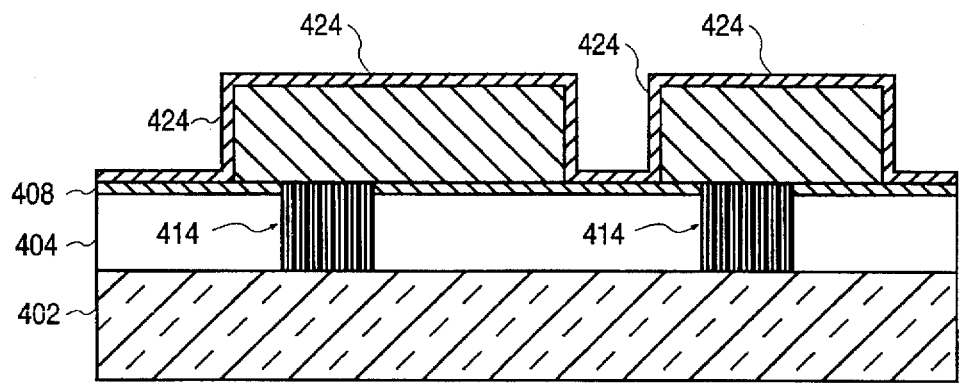
FIG. 4h is a cross-sectional illustration showing the formation of a second barrier layer on the substrate of FIG. 4g.

Next, as shown in FIG. 4h, metal lines 422 can be encapsulated in a second barrier layer 424. Barrier layer 424 prevents lateral diffusion and corrosion of metal lines 422. Barrier layer 424 is formed in the same manner as barrier layer 408. Specifically, a thin metal layer such as aluminum or titanium is sputtered over barrier layer 408 and over and around metal lines 422. The metal layer is then thermally cycled in an oxygen ambient to form a metal-oxide barrier layer 424. Barrier layer 424 prevents lateral diffusion which can cause interlevel shorts between metal lines 422.

Figure 5A:
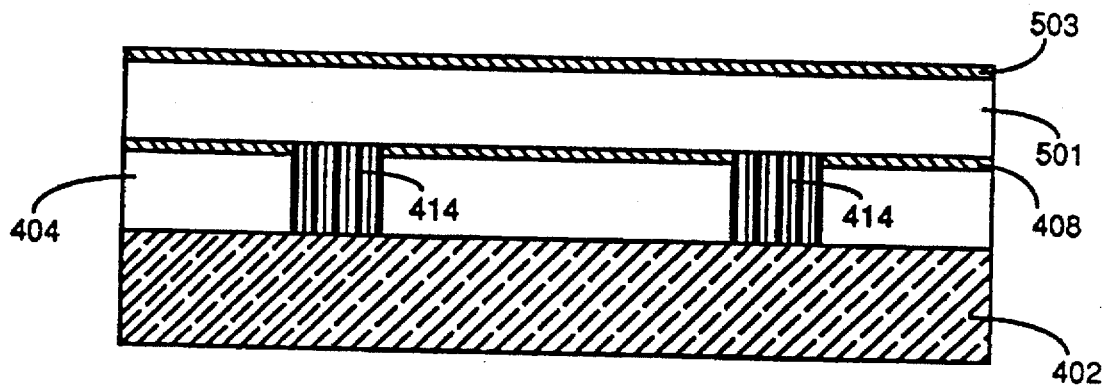
FIG. 5a is a cross-sectional illustration showing the formation of an interlayer dielectric and a thin metal-oxide barrier layer on the substrate of FIG. 4e.

An alternative method of forming metal interconnect lines may also be used in the present invention. As shown in FIG. 5a, a second interlayer dielectric 501 is formed on metal-oxide barrier layer 408 and metal contacts 410 of FIG. 4e. Next, a thin metal-oxide layer 503 is formed over the interlayer dielectric 501. The metal-oxide barrier layer 503 is formed in a manner similar to barrier layer 408 (i.e. a thin metal layer is formed and then oxidized or anodized). The second metal oxide barrier layer and ILD are deposited to a thickness which combined equal the approximate thickness desired of the interconnect lines (i.e. between 4,000–10,000 Å).

Figure 5B:
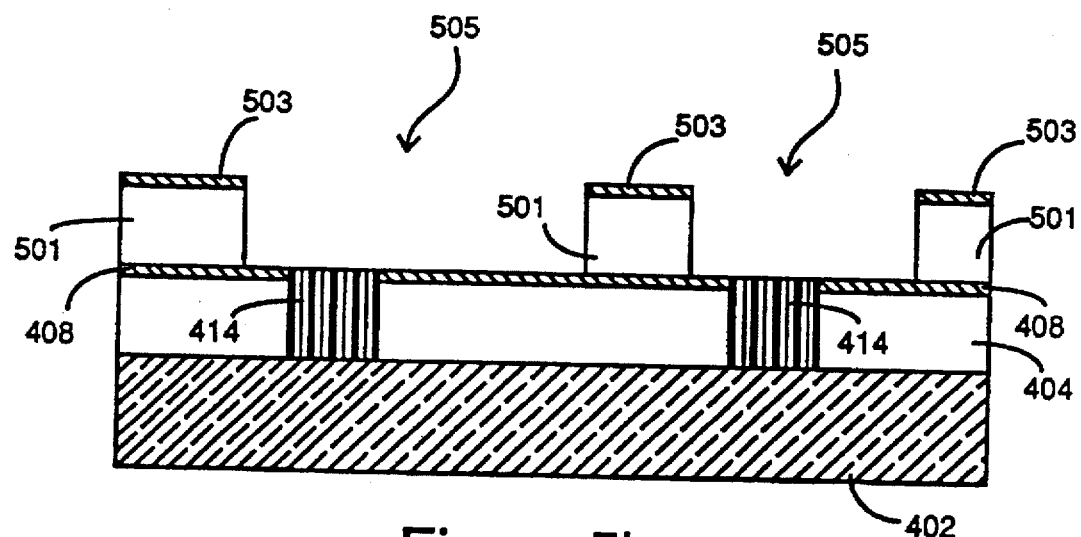

Next a masking layer using, for example, photoresist, is deposited, masked, exposed, and developed with well-known techniques to define the locations where metal interconnects are to be formed. Next, as shown in FIG. 5b, interconnect openings are etched into ILD 501 and metal-oxide barrier layer 503. The interconnect openings are etched to reveal metal-oxide barrier layer 408 and filled contacts 414.

Figure 5C:
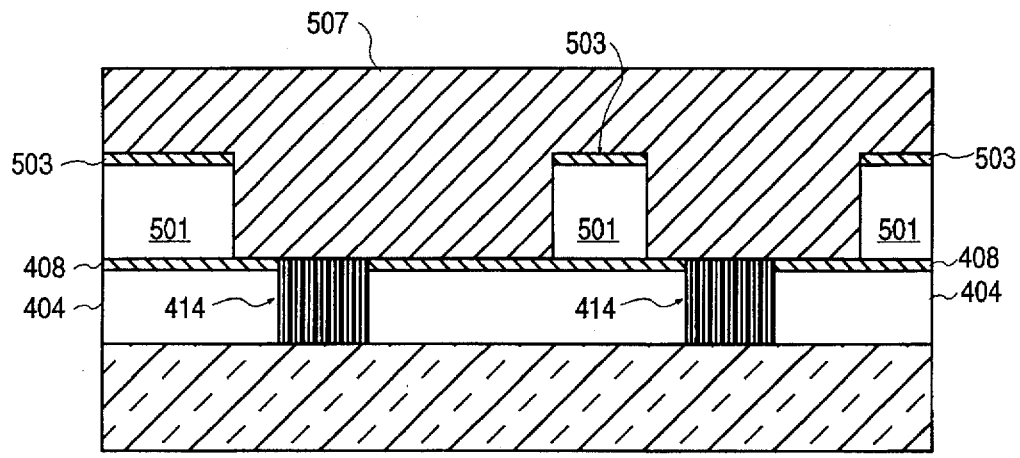
FIG. 5c is a cross-sectional illustration showing the formation of a metal interconnect layer on the substrate of FIG. 5b.
Figure 5D:
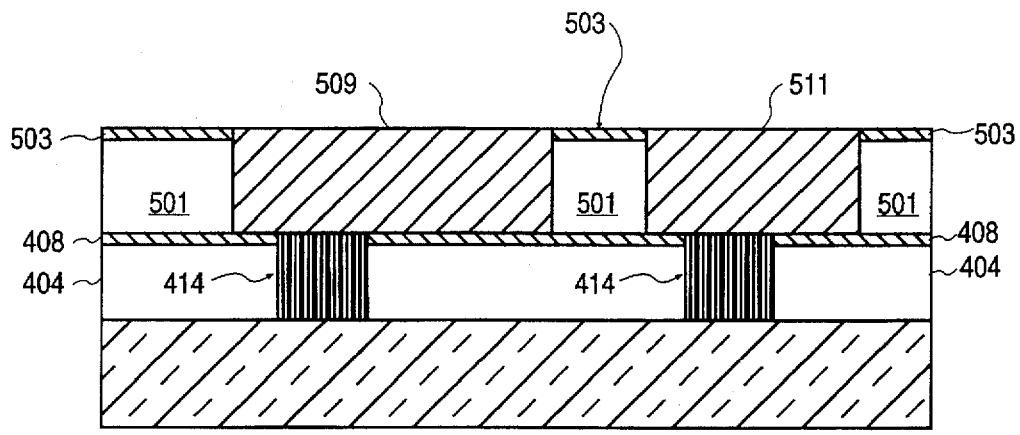
FIG. 5d is a cross-sectional illustration showing the formation of metal interconnect lines on the substrate of FIG. 5c.

Next, as shown in FIG. 5c, an interconnect metal layer 507 is blanket deposited over the entire substrate. In the preferred embodiment metal layer 507 is copper, gold, or silver. Note that although tungsten does not need a barrier against diffusion, it too can benefit from a metal-oxide etch stop. Metal layer 507 can be formed by well-known sputtering or evaporation techniques. Metal layer 507 is deposited to a thickness which is significantly thicker than the desired thickness of the metal interconnect lines in order to allow the use of an etch back process.

Next the metal layer 507 is chemically-mechanically polished back to form individual metal lines 509 and 511. The extremely hard metal-oxide barrier layer 503 acts as a mechanical stop for the chemical-mechanical polish. The chemical-mechanical polishing continues until the metal-oxide barrier layer 503 is completely revealed. Over-etching is used to ensure that no shorts result from incomplete etching. At the completion of the polishing process, second metal-oxide barrier layer 503 and the top surface of metal interconnect lines 509 and 511 are substantially planar. It is to be appreciated that the first metal-oxide barrier layer 408 prevents the diffusion of metal interconnect lines 509 through ILD 404.

In an alternative embodiment of the present invention an aluminum-nitride barrier layer can be substituted for the metal-oxide barrier layer. An aluminum-nitride barrier layer can be formed by first depositing a thin aluminum layer by sputtering, CVD or ion implantation. Next, the aluminum layer is thermally cycled in a nitrogen ambient to form an aluminum-nitride barrier layer. The aluminum-nitride barrier layer can be formed in a single step with CVD or reactive sputtering. Aluminum-nitride can be etched with $Cl_2$ or $BCl_3$ gas in an RIE dry etcher. All other processes or steps for forming a multilevel interconnect structure are identical to those processes or steps disclosed above for a multilevel interconnect structure with a metal-oxide barrier layer. It is to be appreciated that aluminum-nitride compounds are extremely hard substances, making them useful as barrier layers and etch stops.

It is to be appreciated that the novel interconnect structure of the present invention is now complete. It is also to be appreciated that additional ILD's and metalization layers may be formed in order to form additional interconnect levels of a multilevel integrated circuit. It is to be stressed that the teachings of the present invention are equally applicable to higher levels of metalization.

Thus, a novel, high performance, planar, reliable interconnect structure with a ULSI manufacturable process has been described.

I claim:

1. A high performance and reliable interconnect structure for a multilevel integrated circuit formed on a substrate comprising:

an interlayer dielectric formed above said substrate;

a titanium-oxide barrier layer formed on said and in contact with interlayer dielectric; and a metal interconnect formed on and in contact with said titanium-oxide barrier layer on said interlayer dielectric wherein said interlayer dielectric and said titanium oxide barrier layer electrically isolate said metal interconnect.

2. The interconnect structure of claim 1 further comprising a metal contact formed through said interlayer dielectric and said titanium oxide barrier.

3. The interconnect of claim 1 further comprising a metal-oxide barrier layer formed on top of and on the sides of said metal interconnect.

4. The interconnect structure of claim 3 wherein said metal-oxide barrier layer comprises an aluminum-oxide.

5. The interconnect structure of claim 3 wherein said metal-oxide barrier layer comprises a titanium-oxide.

6. The interconnect structure of claim 1 wherein said metal interconnect is selected from the group consisting of gold, silver, copper, and tungsten.

7. The interconnect structure of claim 1 wherein said interlayer dielectric comprises silicon dioxide.

8. The interconnect structure of claim 2 wherein said metal contact comprises tungsten.

9. The interconnect structure of claim 1 wherein said titanium oxide barrier layer is formed to a thickness of between 50–1000 Å.

10. A high performance and reliable interconnect structure for an integrated circuit formed on a semiconductor substrate comprising:

an interlayer dielectric formed above said substrate, wherein said interlayer dielectric comprises a material that is selected from the group consisting of silicon dioxide, polyimide, silicon nitride and parylene;

an aluminum-nitride barrier layer formed on said interlayer dielectric; and a metal interconnection formed on and in contact with said aluminum-nitride barrier layer on said interlayer dielectric.

11. The interconnect structure of claim 10 wherein said aluminum-nitride barrier layer is formed by CVD.

12. The interconnect structure of claim 10 wherein said aluminum-nitride barrier layer is formed by reactive sputtering.

\* \* \* \* \*